United States Patent [19]

Wirz

[11] Patent Number: 4,601,806
[45] Date of Patent: Jul. 22, 1986

[54] MAGNETRON CATHODE FOR SPUTTERING FERROMAGNETIC TARGETS

[75] Inventor: Peter Wirz, Waldernbach, Fed. Rep. of Germany

[73] Assignee: Hans Zapfe, Rodgau, Fed. Rep. of Germany

[21] Appl. No.: 678,239

[22] Filed: Dec. 5, 1984

[30] Foreign Application Priority Data

Dec. 5, 1983 [DE] Fed. Rep. of Germany ....... 3343875

[51] Int. Cl.[4] .............................................. C23C 15/00
[52] U.S. Cl. ..................................................... 204/298
[58] Field of Search ........................................ 204/298

[56] References Cited

U.S. PATENT DOCUMENTS

| 4,198,283 | 4/1980  | Class       | 204/192 R |
| 4,299,678 | 11/1981 | Meckel      | 204/298   |
| 4,431,505 | 2/1984  | Morrison, Jr. | 204/298 |

FOREIGN PATENT DOCUMENTS 2110719A 6/1983 United Kingdom .

Primary Examiner—T. M. Tufariello
Attorney, Agent, or Firm—Felfe & Lynch

[57] ABSTRACT

A magnetron cathode for sputtering targets of ferromagnetic materials. A cathode ground body (2) has at least one supporting surface (4a, 4c) for the target and a magnet system (6) with magnet poles of opposite polarity cohering on the circumference, lying inside one another, and separated by a gap (5a). The target is divided by at least one air gap geometrically similar to the shape of the interval into at least two target parts (12, 13) which are staggered in the direction of the depth of the cathode on the at least one supporting surface (4a, 4c). In accordance with the invention, (a) the magnet system (6) is disposed in back of the farthest set-back supporting surface (4a) for the target (12, 13), and
(b) The width "s" of the air gap (14) in the direction of the depth of the cathode is smaller than the dark space interval necessary under operating conditions.

3 Claims, 7 Drawing Figures

MAGNETRON CATHODE FOR SPUTTERING FERROMAGNETIC TARGETS

The invention relates to a magnetron cathode for sputtering targets of ferromagnetic materials, consisting of a cathode ground body having at least one surface for supporting the target, a magnet system having magnetic poles of opposite polarity joined together on the circumference, situated one inside the other, and separated by an interval, the target being divided by at least one air gap geometrically similar to the shape of the interval into at least two target parts which are offset in the direction of the depth of the cathode on the at least one target-supporting surface.

Magnetron cathodes having planar or curved sputtering surfaces are sufficiently known. In them there is provided a spatially defined arrangement of permanent magnets and/or electromagnets in such a position relative to the sputtering surface that a closed annular tunnel of magnetic lines of force is produced over the sputtering surface, by which the glow discharge which produces the sputtering is limited to an area directly adjacent the sputtering surface, and thus the sputtering rate is increased by more than one power of ten. The term, "sputtering surface," as used herein, refers to the active target surface which is exposed to the glow discharge and from which the atomized particles emerge; as a rule, therefore, it is the face of the target (German Federal Auslegeschrift No. 24 31 832).

Such magnetron cathodes have become known in several variants which either have limited application and/or do not fully perform as expected. In the known embodiment, the pole faces of the magnet system are disposed behind the target, so that the majority of the magnetic lines of force penetrate the target face twice. Such a design, however, is either unusable, or usable only in conjunction with additional measures, for targets of magnetic materials such as are needed, for example, for the production of magnetic recording tapes.

Such measures can consist, for example, of making the target very thin, so that a sufficient number of lines of force can penetrate the target. This, however, requires frequent renewal of the target. Another possibility consists in operating the apparatus in the region of magnetic saturation of the target material, but this requires extraordinarily powerful magnet systems, and it has not as yet been possible to control the distortions of the magnetic field, which change with the increasing consumption of the target material.

It is furthermore possible to heat the target material to a temperature above the specific Curie point, so that the magnetic lines of force can penetrate even relatively thick target plates. The Curie temperatures lie between about 400° and 1100° C., depending on the target material, so that considerable thermal problems are involved in such a solution. It is also known to facilitate the emergence of the lines of force through grooves in the target face (U.S. Pat. No. 4,299,678).

U.S. Pat. No. 4,198,283 discloses a magnetron cathode in which the target, consisting of a plurality of pieces, is clamped between soft-magnetic pole shoes. The nature of the clamping avoids any air gap, and the use of targets of ferromagnetic materials is impossible, because in such a case the magnetic lines of force would enter the target transversely from the pole shoes, so that the formation of a magnetic tunnel, or of the magnetron effect, does not occur.

The unpublished German Offenlegungsschrift No. 33 16 640 discloses a magnetron cathode in which the one magnet pole is disposed behind the central part of the target, which consists of magnetic material. This central part is surrounded, leaving a single air gap, by a peripheral target part which to some extent serves the function of pole shoes. The magnetic lines of force can pass from the peripheral target part into the central target part only in the area of the single circumferential air gap, the maximum sputtering action taking place precisely in the region of the air gap, which for this purpose must be wider than the dark space required under operating conditions, i.e., must be at least 3 mm wide. In the surroundings of the air gap, however, there is relatively little sputtering material, and the air gap is even widened by the sputtering process. Therefore, special measures must be taken to prevent material from being sputtered from the bottom of the air gap, which in the case of an incompatible material would contaminate the deposited coatings. With such a system, material can be sputtered substantially only in the immediate vicinity of the air gap, so that the degree of utilization of the material is very low. The high magnetic field concentration adjacent the single air gap, which is detrimental to the broad ablation of the target material, is even intensified by directly coupling the target parts to the magnet poles through highly permeable components.

German Federal Offenlegungsschrift No. 32 44 691 discloses a magnetron cathode of the kind described in the beginning, in which the permanent magnets are disposed in front of a plane which is formed by the sputtering surface of the target. Thus the permanent magnets are situated in a zone of extreme thermal stress, so that the system described must be very effectively cooled. Since the permanent magnets cannot be of less, than a certain axial length of about 8 to 10 mm in view of the required direction of magnetization, the pole shoes are provided on their inside edges with collar-like projections to limit the air gap width. The lines of force emerging at the edges of the collar are deflected on a very short path into the target material, from which, following the path of least resistance, they reenter the opposite poles of the permanent magnets, because the ferromagnetic target, the ferromagnetic support plate and the permanent magnets are seated directly one on the other. The result is a narrow circumscription of the "magnetic trap," so that, instead of a desirable broad-surface ablation of the target material, two ditch-like erosion zones result under the collar edges. Due to the system of collars, the cost of the manufacturing process is made substantially more expensive, which is disadvantageous inasmuch as the pole shoes themselves participate in the sputtering process, so that a short life is the result.

The invention is therefore addressed to the problem of improving a magnetron cathode of the kind described in the beginning such that it can be used to sputter ferromagnetic target material economically, i.e., over an extended running time, with a high specific sputtering output, and a high degree of utilization of the material, without thereby requiring a complex cathode construction.

The solution of the stated problem is accomplished in the magnetron cathode described in the beginning, by (a) disposing the magnet system behind the rearmost target bearing surface and (b) making the width "s" of the air gap in the direction of the depth of the cathode smaller than the dark space interval required under operating conditions.

The width "s" of the air gap can amount to between 0.5 and 2.5 mm. In the manner described, an air gap defined by plane-parallel walls is formed, which is so narrow that no glow discharge which might at this point cause sputtering can form in this gap.

By the feature (a) it is brought about, in comparison with German Offenlegungsschrift No. 32 44 691, that the magnet system is situated in an easily cooled area of the cathode ground body. In spite of the simple cathode construction which this entails, the cathode can be operated for long periods of time at a high specific output, without unacceptable thermal stress on the magnet system.

By the feature (b) it is brought about, in comparison with German Offenlegungsschrift No. 33 16 640, that the sputtering process takes place exclusively outside of the air gap or gaps. Thus, neither can any contaminating material be sputtered out of the bottom of the air gap, nor does the width of the air gap increase in extended operation, i.e., the constant distribution of the lines of force necessary for high repeatability is maintained. The material ablation is thus distributed over a greater surface area, so that the so-called degree of utilization of the material is markedly improved.

The above-described effect can also be seen clearly in the operation of the magnetron cathode: over the sputtering surface an intense tube of plasma forms in the area adjacent the air gap, depending on the number of air gaps, which follows the configuration of the air gap. In the region of these plasma tubes, which extend over a considerable part of the surface of the target, a high degree of ionization by secondary electrons prevails.

Even thick, plane-parallel target plates can be sputtered by the magnetron cathode of the invention. This possibility is created especially by the fact that magnetic saturation of the target material is not necessary. As a result, the magnetron cathode can be operated for a long period of time between target changes, so that the entire system is economical to operate. As it is known, such equipment entails a high capital investment.

At the same time it is especially advantageous, in accordance with the further invention, if the projections of the target parts onto a plane parallel to the sputtering surface overlap in a substantially uniformly wide area by an amount "d," including the at least one air gap. This overlap dimension can be between 2 and 10 mm, depending on the thickness of the target.

An especially advantageous embodiment of the invention is characterized, in accordance with the further invention, by the fact that, in a three-part target, (a) One target plate is divided by a circumferential gap into two target parts lying between common planes, the configuration of the gap being similar to the configuration of the interval between opposite poles, (b) The gap is filled by the projection made of a non-ferromagnetic but electrically conductive material, which projects beyond the sputtering surface of the target parts, (c) A third target part is placed on the projection and is made annularly continuous, and its configuration follows the configuration of the projection, and (d) The third target part projects on both sides beyond the projection and forms an air gap with each of the target parts.

By the measures described above, a doubling of the effect is achieved, and with it a substantially improved degree of utilization of the target material and a higher sputtering efficiency of the entire magnetron. Either the same coating thicknesses can be produced in less time or greater coating thicknesses can be produced in the same time. This is especially advantageous when large-area substrates are moving relative to the magnetron cathode.

Embodiments of the invention are further explained hereinafter in conjunction with FIGS. 1 to 7.

Figure 1:
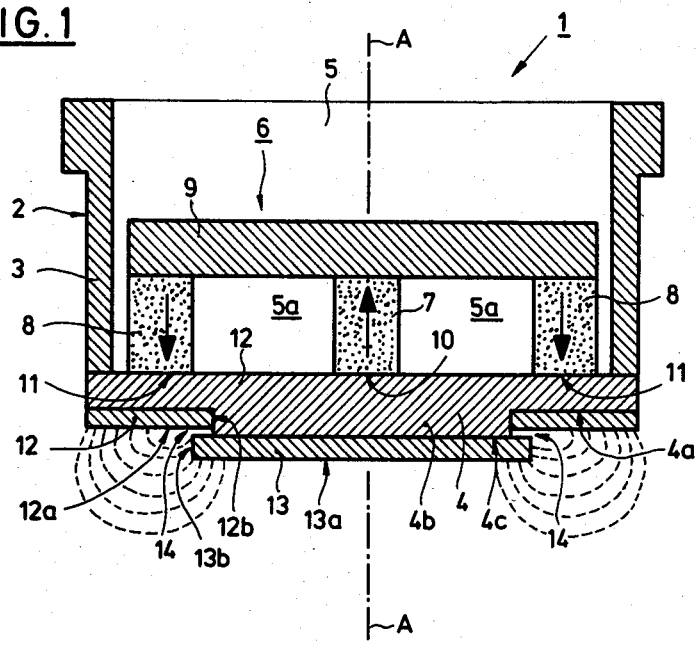
FIG. 1 shows an axial section through a rotationally symmetrical magnetron cathode having a continuous annular air gap.

FIG. 1 shows a magnetron cathode 1 having a pot-like hollow body 2 consisting of a rim 3 and a bottom 4 surrounding an approximately cylindrical cavity 5. The hollow body 2 is fastened to a support plate which is not shown, by which the magnetron cathode is in turn connected with a vacuum chamber, also not shown. Details of such a system can be found in German Offenlegungsschrift No. 30 47 113.

In the cavity 5 there is a magnet system 6 which consists of numerous permanent magnets 7 and 8. Permanent magnet 7 is a cylindrical magnet, while a closed, circular row of permanent magnets 8 surrounds the central permanent magnet 7 and is spaced away therefrom. The permanent magnets have a polarity defined by the arrows, i.e., in the central permanent magnet 7 the north pole is at the top, for example, while in the outer permanent magnets 8 all of the south poles are at the top. The magnet poles are separated by a continuous circular gap 5a surrounding the permanent magnet 7.

All of the upper pole faces of the permanent magnets are in contact with a ferromagnetic yoke plate 9, while the opposite pole faces 10 and 11 lie on the bottom 4. This bottom has a support surface 4a in the form of a circular annular surface bonded by face brazing, for example, to a congruent, circular annular target part 12. The target part 12 has a likewise annular circular sputtering surface 12a as well as an opening 12b formed by cutting out a disk-like portion. Into this opening extends a projection 4b which can be part of the bottom 4, but also can be formed by brazing onto it a disk of corresponding shape. This projection is electrically conductive, and consists generally of copper, since the rim 3 and the bottom 4 are made, as a rule, of copper.

The projection 4b extends below the sputtering surface 12a and bears a target part 13 which, like target part 12, consists of a ferromagnetic material. Projection 4b and target part 13 make surface contact at a planar support surface 4c. The target part 13 has an outer surface 13a which consists of identical ferromagnetic material; preferentially, however, the entire target part 13 consists uniformly of ferromagnetic material.

Between the target parts 12 and 13 a circular annular air gap 14 is present along their circumference in the direction of the depth of the cathode. On account of the overlapping to be described further below, this air gap is defined by plane-parallel walls and has a width between 0.5 mm and 2.5 mm and, in projection, lies within the gap 5a.

The overlap is a result of the fact that the projections of the target parts 12 and 13 overlap in a plane parallel to the sputtering surface 12a, and the overlap is equally wide over the entire circumference. No glow discharge is burning in the air gap, so that no sputtering takes place at this point.

The target part 13 has a lateral edge surface 13b which in the present case is a cylindrical surface, and its generatrix is consequently perpendicular to the sputtering surface 12a.

The lateral edge surface 13b is simultaneously the emergence surface or pole surface, from which a great part of the magnetic lines of force emerge in the direction of the target part 12. A portion of the lines of force, of course, also emerges from the outside surface 13a, with a diminishing tendency toward the center. The lines of force have substantially the configuration represented in FIG. 1, while, due to the different radial position of the culmination points of the lines of force, it can be concluded that correspondingly wide erosion ditch will result in the target part 12 after a relatively long sputtering time. The illustrated force line configuration is possible only because the target parts 12 and 13 include between them the air gap 14 which prevents a magnetic short circuit and forces the flux to enter and leave in the manner illustrated. The configuration of the air gap 14 is geometrically similar to the configuration of the gap [5a] and, as it can be seen in FIG. 1, the support surfaces 4a and 4c, and hence the target parts 12 and 13, are offset in depth.

As it has already been explained, FIG. 1 shows an axial cross section through a rotationally symmetrical magnetron cathode. However, it will also be shown in conjunction with FIGS. 3 and 4 that the invention is not limited to a rotationally symmetrical system, but can also be used in so-called oval or rectangular cathodes. To simplify the description, however, the following explanations are given in conjunction with a rotationally symmetrical system.

Figure 2:
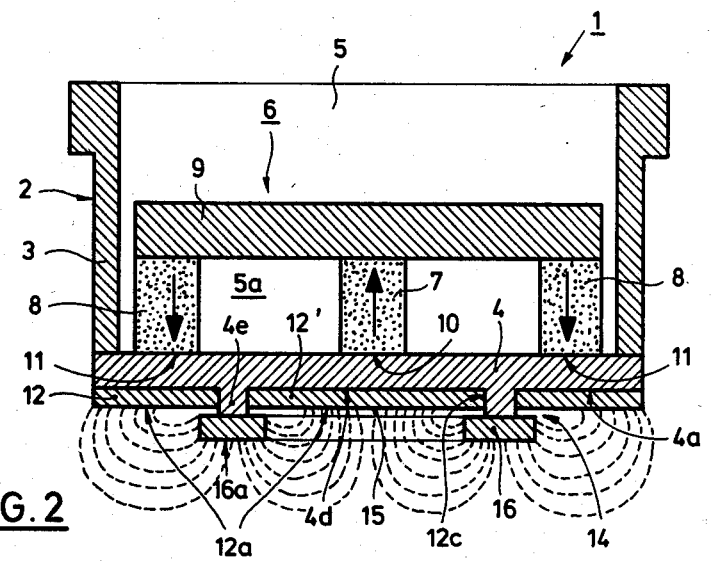
FIG. 2 shows an axial section similar to FIG. 1, but in a magnetron cathode having two continuous annular air gaps.

In FIG. 2, parts that are the same as in FIG. 1 are provided with the same reference numbers. The main difference in this case is in the bottom 4, and the target parts 12, 12' and 13.

In the present case the target is interrupted by a circumferential gap 12c which has a width of a few millimeters whereby an annular circular target part 12' is formed which is concentric with the annular circular target part 12. In its place the bottom 4 has an additional supporting surface 4d which lies in a common plane with the supporting surface 4a. If the target parts 12 and 12' have the same thickness, their faces will also lie in common planes.

The gap 12c has a configuration geometrically similar to the gap 5a, i.e., the two are coaxial, the average diameter of the gap 12c being able to differ slightly from the average diameter of the gap 5a. The bottom 4 has a projection 4e which is substantially complementary to the gap 12c, namely an annular projection 4e, which reaches below the sputtering area 12a extending over both target parts 12 and 12'. The projection in this case too can be produced as in FIG. 1 by brazing a low ring onto the bottom 4. The projection 4e has an circular annular surface on which a circular annular target part 16 is fastened, which consists of the same material as the target parts 12 and 12'. The target part 16 overlaps the projection 4e on both sides by approximately equal amounts. In this manner, and also due to the greater axial thickness of the projection 4e, air gaps 14 and 15 are produced which are defined by plane-parallel walls on both sides of the projection 4e.

The two air gaps 14 and 15 have a similar configuration and function to those of the single air gap 14 present in FIG. 1. The only difference is that the air gap 15 face 12a of the inner target part 12' serves as a surface for the entry of the magnetic flux which emerges from the target part 16 mostly in the area of the inner cylindrical edge surface of the target part 16.

The basic configuration of the magnetic lines of force is also indicated in FIG. 2, and it can be seen that, in the interior of target part 16, an additional plasma trap or additional magnetron effect is produced, so that the process in principle is doubled. Thus the efficiency with regard to the entire underside of the magnetron cathode is substantially increased, to as much as twice the amount, depending on the geometrical shape of the cathode (FIGS. 3 and 4).

It can be seen that here, too, the shape of the overlaid target part 16 follows the shape of the projection 4e, so that the depth of the air gaps 14 and 16 corresponding to the overlap is constant on the entire circumference.

In further development of the subject of FIG. 2, the target can also be interrupted repeatedly with multiple repetition of this principle, thereby permitting both the sputtering performance and the degree of utilization of the target material to be further increased.

Figure 3:
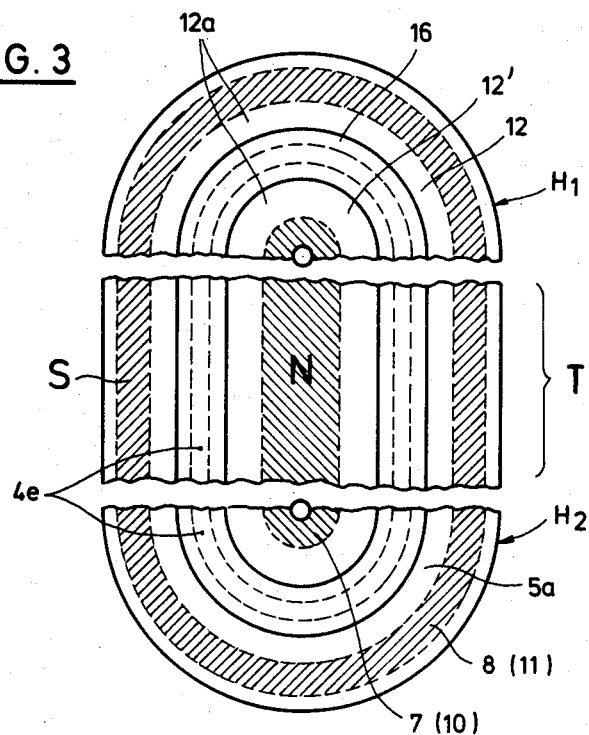
FIGS. 3 & 4 show plan view of different forms of the magnetron and their possible variants.
Figure 4:
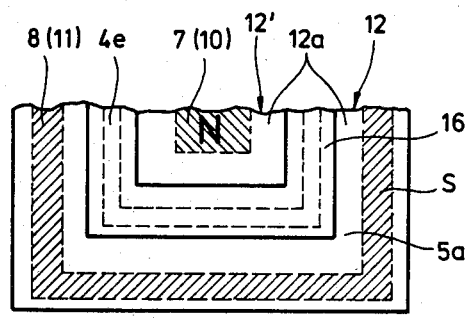

In FIG. 3, which is a plan view of the face of the sputtering surface 12a, sections of magnetron cathodes of different geometrical shapes are represented. The halves H-1 and H-2 of the magnetron cathode of FIG. 2 are represented at the top and bottom, respectively, i.e., the combining of the two halves H-1 and H-2 results in a rotationally symmetrical magnetron as in FIG. 2. If between the two halves H-1 and H-2 a rectilinear part T is inserted, in which all of the sputtering surfaces, lateral surfaces, emergence surfaces and air gaps merge with the corresponding parts of the rotationally symmetrical halves, the result will be an elongated magnetron cathode of virtually any desired length. Such magnetron cathodes can be produced in lengths of about 4 meters and widths of about 0.2 to 0.5 meters, so that, with the performance of a relative movement, they can be used for coating substrates of great area such as architectural glass, for example. The geometrical configuration and arrangement of the permanent magnets 7 and 8 and of their pole faces 10 and 11 is indicated by broken lines and shading. Likewise, the peripheral edges of projection 4e, on which the target part 16 is fastened, are indicated by broken lines. The cross section shown in FIG. 2 can also be transferred to the cross section of the rectilinear part T. The configuration of the plasma captured by the magnetic fields corresponds, then, to the configuration of target part 16, so that the term "racetrack" is also used in referring to the enclosure in which the plasma forms.

It is not necessary, however, to make the ends of an elongated magnetron cathode like that of FIG. 3 rotationally symmetrical. Instead, these ends can also be made rectangular as represented in FIG. 4.

Figure 5:
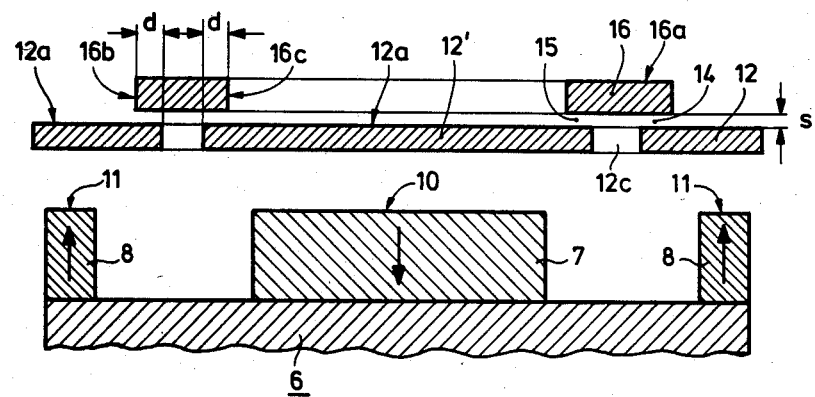
FIGS. 5 to 7 show an axial section through the subject of FIG. 2 omitting the components which do not affect the field configuration, and the flow diagrams associated with the system in FIG. 5, namely as horizontal component (FIG. 6) and as vertical component (FIG. 7).
Figure 6:
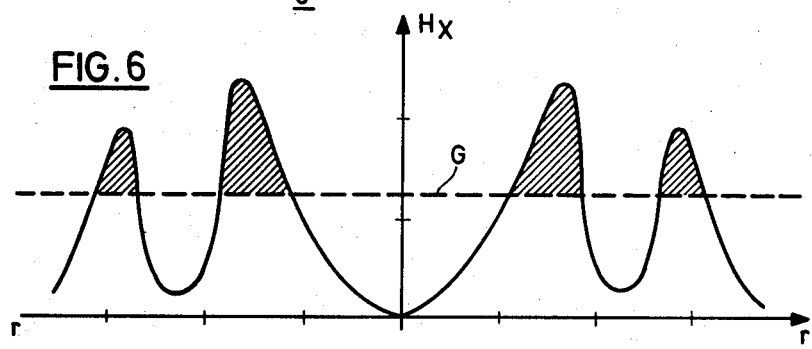
Figure 7:
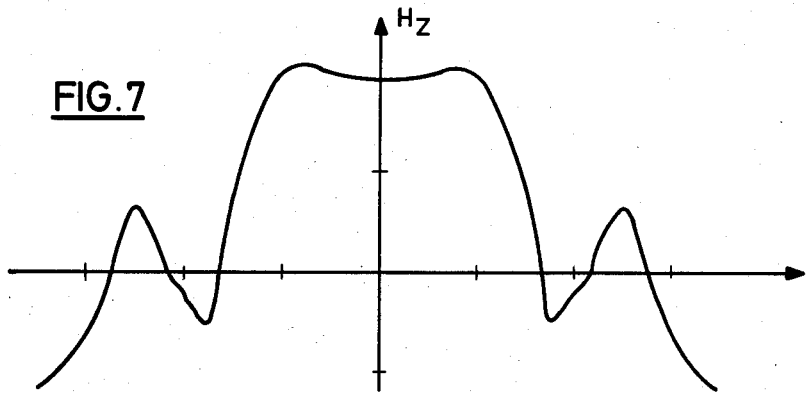

In FIG. 5, only the parts which have a determining influence on the configuration of the magnetic flux are represented, using the same reference numbers as above. This is the magnet system 6 with the permanent magnets 7 and 8, and the target parts 12, 12' and 16; the bottom 4 of the hollow body 2 which holds these parts apart from one another is omitted. The arrangement is represented as an inversion of FIG. 2, since the measurements of the magnetic fields, whose result is represented in FIGS. 6 and 7, are performed in this position.

In FIG. 5, the overlaps "d" of the target part 16 in relation to target parts 12 and 12' are represented as being of the same size. The overlap zones, however, can also be made of different widths for the purpose of altering the depth of the gap and thus the distribution of the magnetic flux, in which case care need only be taken to see that the size of the overlap "d" is at least as great as the thickness of the target part 16, since the material in the area of the overlap is consumed or sputtered away until the target material is exhausted. The thickness of the target material 16 should amount to at least 0.5 mm to provide a sufficient target life, but preferably it should correspond to the thickness of target parts 12 and 12', which can easily amount to 10 to 15 millimeters.

For reasons pertaining to the manufacture of the target part 16, the lateral surfaces 16b and 16c thereof are at least initially perpendicular to the sputtering surface 12a, i.e., in the case of a rotationally symmetrical cathode system these surfaces are surfaces of a cylinder. It is also possible, however, to configure them as surfaces of a cone, in which case the cross section of target part 16 diminishes with increasing distance from the sputtering surface. In like manner it is also possible to make the outer circumferential edges of target part 16 well rounded.

The dimension "s" for the width of the air gaps is also indicated in FIG. 5. This gap width is selected between 0.5 and 2.5 millimeters. On the one hand the gap must not be so narrow that it might become filled with ferromagnetic material, but on the other hand it must not be so large that the glow discharge might reach into the gap.

The proportions represented in FIG. 5 are on a scale of 2:1. For purposes of measurement, the target parts 12, 12' and 16 consist of sheet iron 3 mm thick. The magnet system was that of a commercial magnetron cathode of the firm of Leybold-Heraeus GmbH of Hanau, Federal Republic of Germany, as sold under the model number PK 75 (75 mm diameter). The gap amounted to 1 mm, since the height of the projection 4e (FIG. 2) was 4 mm. The dimension "d" of the overlap on both sides of the target part 16 was 4 mm. On such a magnetron cathode, first the horizontal component of the magnetic field strength (Hx) is measured and plotted along the radius "r" of the target. The abscissae values of FIGS. 6 and 7 are in scale with FIG. 5. In FIG. 6 a horizontal broken boundary line "G" is drawn. The position of this boundary line indicates the field strength above which a marked sputtering effect takes place. In the shaded parts of the curves, therefore, a sputtering of the target material takes place, i.e., it is apparent that, by means of a single magnet system, two relatively broad sputtering zones are achieved, which substantially increase the degree of utilization of the target material. Degrees of utilization between about 40 and 50% have been measured.

In FIG. 7, the vertical component of the magnetic field strength distribution is plotted on the same scale as in FIG. 6. In this curve the nulls are of interest. On each side there are three nulls which theoretically indicate three erosion pits. It appears from FIG. 6, however, that in this system the valley between the crests on both sides of the ordinates is so deep that a sufficient sputtering rate is not to be expected at the middle nulls. By modifying the thickness of target part 16 it is thus possible to fasten it by means of screws lying on the central radius, without these screws being sputtered. By varying the magnetic field, however, it is also possible to utilize all three erosion pits. In this case the screw fastening is replaced by brazing or bonding the target part in question.

The dark space interval is a magnitude that determines the design of sputtering cathodes. The glow discharge that produces the sputtering is stable only within a very specific pressure range whose order of magnitude is between $2 \times 10$ and $5 \times 10$ mbar, for reasons inherent in ionization probability. The pressure-related dark space intervals which are established in this case are greater than 0.5 mm, but less than approximately 2.0 to 2.5 mm, i.e., the gap width "s" must be in the stated range from 0.5 to a maximum of 2.5 mm, if the formation of a glow discharge in the correspondingly dimensioned gap is to be reliably prevented. A gap width "s" of 1.5 mm has proven to be optimum for operation within the above standard pressure range, also with regard to production tolerances.

We claim:

1. In a magnetron cathode for the sputtering of targets of ferromagnetic materials, consisting of a cathode ground body having at least one supporting surface for the target, a magnet system having magnet poles of opposite polarity cohering on the circumference, situated one within the other, and separated by an interstice, the target being divided by at least one air gap geometrically similar to the configuration of the interstice into at least two target parts which are staggered in the direction of the depth of the cathode on at least one supporting surface, and wherein the magnet system is disposed behind the farthest set-back supporting surface for the said target parts and the width "s" of the air gap in the direction of the depth of the said cathode is smaller than the dark space interval required under operating conditions, the improvement which comprises providing step-wise divisions of the said supporting surface by nonferromagnetic but electrically conductive projections such that there are at least three target parts disposed on individual steps, and such that the projections extend over the sputtering surfaces of the farthest set-back cathode parts only to such an extent that the width of the said air gaps is smaller than the dark space intervals necessary under operating conditions.

2. A magnetron cathode of claim 1, characterized in that the said overlap is at least one-third of the target thickness.

3. A magnetron cathode of claim 1, characterized in that the width "S" of the air gap amounts to between 0.5 and 2.5 mm.

* * * * *

UNITED STATES PATENT AND TRADEMARK OFFICE
CERTIFICATE OF CORRECTION

PATENT NO. : 4,601,806
DATED : July 22, 1986
INVENTOR(S) : Peter Wirz

It is certified that error appears in the above-identified patent and that said Letters Patent is hereby corrected as shown below:

Item [73], "Hans Zapfe, Rodgau," should be
-- Leybold-Heraeus GmbH, Köln, --.

Signed and Sealed this

Seventh Day of April, 1987

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,601,806

DATED : July 22, 1986

INVENTOR(S) : Peter Wirz

It is certified that error appears in the above-identified patent and that said Letters Patent is hereby corrected as shown below:

Column 6, line 11, insert -- faces radially inwardly, so that now the sputtering surface-- between "face" and "12a"

Signed and Sealed this

Tenth Day of November, 1987

Attest:

DONALD J. QUIGG

Attesting Officer     Commissioner of Patents and Trademarks